(12) United States Patent
Fryska et al.

(10) Patent No.: US 10,017,426 B2
(45) Date of Patent: Jul. 10, 2018

(54) HIGH DENSITY CARBON-CARBON FRICTION MATERIALS

(71) Applicant: Honeywell International Inc., Morris Plains, NJ (US)

(72) Inventors: Slawomir T. Fryska, Granger, IN (US); Neil Murdie, Granger, IN (US); Mark L. La Forest, Theresa, NY (US)

(73) Assignee: Honeywell International Inc., Morris Plains, NJ (US)

( * ) Notice: Subject to any disclaimer, the term of this patent is extended or adjusted under 35 U.S.C. 154(b) by 34 days.

(21) Appl. No.: 15/088,941

(22) Filed: Apr. 1, 2016

(65) Prior Publication Data

US 2017/0283330 A1 Oct. 5, 2017

(51) Int. Cl.
| | | |
|---|---|---|
| C04B 35/83 | (2006.01) | |
| C04B 35/622 | (2006.01) | |
| C04B 35/645 | (2006.01) | |
| C23C 16/26 | (2006.01) | |

(52) U.S. Cl.
CPC ........ *C04B 35/83* (2013.01); *C04B 35/62272* (2013.01); *C04B 35/6455* (2013.01); *C23C 16/26* (2013.01); *C04B 2235/422* (2013.01); *C04B 2235/5248* (2013.01);
(Continued)

(58) Field of Classification Search
CPC ............................ C04B 35/83; C04B 35/6455
See application file for complete search history.

(56) References Cited

U.S. PATENT DOCUMENTS

| | | | |
|---|---|---|---|
| 5,114,635 A | * | 5/1992 | Sohda ............... C04B 35/83 264/29.1 |
| 5,277,973 A | | 1/1994 | Yamamura et al. |
| 6,342,171 B1 | | 1/2002 | Murdie et al. |

(Continued)

FOREIGN PATENT DOCUMENTS

| | | |
|---|---|---|
| EP | 0323750 A1 | 12/1989 |
| EP | 2309147 A1 | 4/2011 |
| WO | 2008093078 A1 | 8/2008 |

OTHER PUBLICATIONS

Makomaski, G., et al., "Study on the preparation of activated carbons from pitch-polymer compositions," Chemik, Science Technique, vol. 67, No. 9, Sep. 2013, 3 pp.
(Continued)

*Primary Examiner* — Robert A Vetere
(74) *Attorney, Agent, or Firm* — Shumaker & Sieffert, P.A.

(57) ABSTRACT

A technique of forming a carbon-carbon composite that includes infiltrating a preform comprising carbon fibers or carbon-precursor fibers with a pitch and pyrolyzing the pitch using a controlled pressure and temperature ramp rate to control a growth of optical textures as the pitch is pyrolyzed to a coke matrix. Pyrolyzing the pitch may include initiating pyrolysis of at least some of the pitch at a first pressure less than about 2000 psi and a first temperature ramp rate between about 5° C./hr and about 50° C./hr to a first target temperature, and pyrolyzing at least some of the pitch at a second pressure greater than 2000 psi and a second temperature ramp rate between about 5° C./hr and about 50° C./hr to a second target temperature, where the second target temperature is greater than the first target temperature.

16 Claims, 6 Drawing Sheets

(52) U.S. Cl.
CPC ..... *C04B 2235/658* (2013.01); *C04B 2235/6562* (2013.01); *C04B 2235/661* (2013.01)

(56) References Cited

U.S. PATENT DOCUMENTS

| | | | |
|---|---|---|---|
| 6,432,536 | B1 | 8/2002 | Hecht et al. |
| 6,699,427 | B2 | 3/2004 | Huang et al. |
| 6,705,385 | B2 | 3/2004 | Ray et al. |
| 6,878,331 | B2 | 4/2005 | Huang et al. |
| 7,296,691 | B2 | 11/2007 | Koslow |
| 7,897,072 | B2 | 3/2011 | La Forest et al. |
| 8,003,026 | B2 | 8/2011 | La Forest et al. |
| 2002/0090873 | A1 | 7/2002 | Moody |
| 2003/0111752 | A1 | 6/2003 | Wood et al. |
| 2004/0105969 | A1* | 6/2004 | Huang ............... C04B 35/521 428/292.1 |
| 2005/0106373 | A1 | 5/2005 | Economy et al. |
| 2006/0151912 | A1* | 7/2006 | Bauer ............... C04B 35/6269 264/257 |
| 2009/0297707 | A1 | 12/2009 | La Forest et al. |
| 2011/0033622 | A1 | 2/2011 | La Forest et al. |

OTHER PUBLICATIONS

Chung, "Chapter 1.3 Processing of Composite Materials," Composite Materials: Science and Applications (Engineering Materials and Processes), 2nd Edition, Springer, 2010, pp. 8-27 (Applicant points out, in accordance with MPEP 609.04(a), that the year of publication, 2010, is sufficiently earlier than the effective U.S. filed, Apr. 1, 2016, so that the particular month of publication is not in issue.).

Hoffman, "In Situ Processing Route for Uniform Density Carbon-Carbon Composites," AFRL/PRSM, Authorization for Release of Technical Information, Control No. AFRL-PR-ED-TP-2001-217, Oct. 31, 2001, 4 pp.

Weber et al., "Densification of Carbon-Carbon Composites at 30 KSI," 1977 Proceedings—13th Biennial Conference, Aerospace Applications (la), Jun. 18-22, 1977, pp. 68-69.

U.S. Appl. No. 14/788,336, by Honeywell International Inc. (Inventors: Mark LaForest et al.), filed Jun. 30, 2015.

Morgan, "Chapter 14: Carbon Fiber Carbon Matrix Composites," Carbon Fibers and Their Composites, CRC Press, May 20, 2005, pp. 551-582.

Extended Search Report from counterpart European Application No. 17157743.0, dated Aug. 9, 2017, 7 pp.

Response to Extended Search Report dated Aug. 9, 2017, from counterpart European Application No. 17157743.0, filed Nov. 15, 2017, 45 pp.

\* cited by examiner

FIG. 6B

HIGH DENSITY CARBON-CARBON FRICTION MATERIALS

TECHNICAL FIELD

The disclosure relates to the manufacture of carbon-carbon composite materials, and especially to the manufacture of aircraft brake discs made of carbon-carbon composite materials.

BACKGROUND

Carbon-carbon (C—C) composites can be used in many high temperature applications. For example, the aerospace industry employs C—C composite components as friction materials for commercial and military aircraft, such as brake friction materials. Some carbon-carbon composites, such as some carbon-carbon composite brake discs that are used in the aerospace industry, may be manufactured from porous preforms. The porous preforms may be densified using a combination of several processes, including chemical vapor deposition/chemical vapor infiltration (CVD/CVI), vacuum/pressure infiltration (VPI), or resin transfer molding (RTM), which may be used to deposit carbon precursor material within the porous preform. CVD/CVI processing is an expensive and time-consuming process, frequently taking several months to complete. In some examples, the cycle time and costs associated with CVD/CVI processing may be reduced by using VPI or RTM alone or in combination with CVI/CVD. VPI and RTM processes, however, may require several cycles over a prolonged period of time and may result in relatively low density composites.

SUMMARY

In some examples, the disclosure describes a technique of forming a carbon-carbon composite that includes infiltrating a preform comprising carbon fibers or carbon-precursor fibers with a pitch to form an infiltrated preform and pyrolyzing the pitch in the infiltrated preform using a controlled pressure and temperature ramp rate to control a growth of optical textures as the pitch is pyrolyzed to a coke matrix. In some examples, pyrolyzing the pitch using the controlled pressure and temperature ramp rate may include initiating pyrolysis of at least some of the pitch at a first pressure and a first temperature ramp rate to a first target temperature, where the first pressure is less than about 2000 pounds per square inch (psi), where the first temperature ramp is between about 5 degrees Celsius per hour (5° C./hr) and about 50° C./hr; and pyrolyzing at least some of the pitch at a second pressure and a second temperature ramp rate to a second target temperature, where the second pressure is greater than 2000 psi, where the second temperature ramp rate is between about 5° C./hr and about 50° C./hr, and where the second target temperature is greater than the first target temperature.

In some examples, the disclosure describes a technique for making a carbon-carbon composite brake disc that includes pyrolyzing a pitch in a preform using a controlled pressure and temperature ramp rate to control a growth of optical textures formed as the pitch is pyrolyzed to a coke matrix, where the preform comprises carbon fibers or carbon-precursor fibers, where the pitch comprises at least one isotropic pitch. In some example, pyrolyzing the pitch using the controlled pressure and temperature ramp rate includes heating the pitch and the preform in a vessel at a first pressure less than about 2000 psi at a first temperature ramp rate between about 5° C./hr and about 50° C./hr to a first target temperature less than about 450° C. to convert at least some of the pitch to the coke matrix, wherein the coke matrix includes at least one optical texture; increasing a pressure in the vessel from the first pressure to a second pressure between 2000 psi and about 15,000 psi; and heating the pitch and the preform in the vessel at the second pressure, at a second temperature ramp rate between about 5° C./hr and about 50° C./hr to covert the remaining pitch to the coke.

In some examples the disclosure describes an assembly for making a carbon-carbon composite that includes a vessel, a pitch-infiltrated preform in the shape of the carbon-carbon composite disposed in the vessel, and a pressure and heat source. In some examples, the pitch-infiltrated preform includes an isotropic pitch, and a preform derived from a plurality of layers that includes carbon fibers or carbon-precursor fibers and needled fibers that include carbon fibers or carbon-precursor fibers. In some examples, the a pressure and heat source are configured to apply a first pressure less than about 500 psi to the pitch-infiltrated preform deposited in the vessel and heat the pitch-infiltrated preform over a first range of temperatures at a first temperature ramp rate between about 5° C./hr and about 50° C./hr to initiate pyrolysis of the isotropic pitch to a coke matrix, and then apply a second pressure greater than about 10,000 psi to the pitch-infiltrated preform deposited in the vessel and heat the pitch-infiltrated preform over a second range of temperatures at a second temperature ramp rate between about 5° C./hr and about 50° C./hr to complete pyrolyze the isotropic pitch to coke matrix.

The details of one or more examples of the disclosure are set forth in the accompanying drawings and the description below. Other features, objects, and advantages of the disclosure will be apparent from the description and drawings, and from the claims.

DETAILED DESCRIPTION

The present disclosure describes techniques for forming a densified carbon-carbon (C—C) composite from a pitch-infiltrated preform. In some examples the techniques may be used to selectively to control a growth of the optical textures as the pitch is pyrolyzed to a coke. In some examples, the techniques may be used to convert isotropic pitch into a coke matrix that includes a higher concentration of large-sized textures that define a major dimension greater than about 10 microns (e.g., anisotropy or domain type textures). The presence of the relatively large-sized optical textures of the coke matrix in the C—C composites may improve the thermal properties of the resultant C—C composites, compared to C—C composites including coke matrices with small optical textures (e.g., mosaic type textures with major dimensions less than 10 micrometers). In some examples, the densified C—C composites of the present disclosure may also produce a composite with a density of at least about 1.9 grams per cubic centimeter (g/cc). Composites having a density of at least about 1.9 g/cc may possess mechanical and thermal properties, including friction and wear performance, that are improved compared to lower density C—C composites. For example, obtaining a higher density in the carbon-carbon composite may improve the thermal conductivity of the composite or may provide enhanced structural strength. Densified C—C composites possessing improved densities and higher concentration of large-sized optical textures in accordance with the disclosure may be useful in a variety of applications including, for example, use in the aerospace industry as brake discs.

Figure 1:
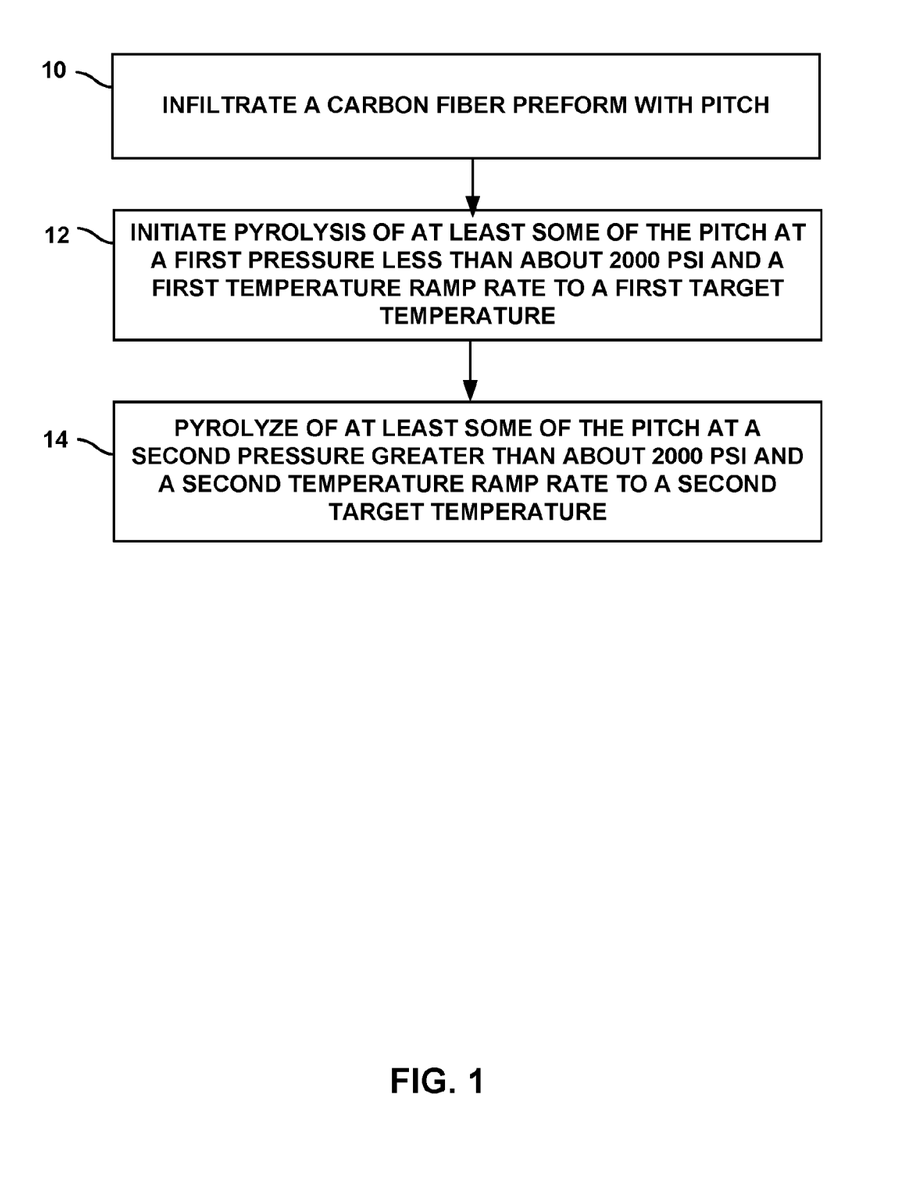
FIG. 1 is a flow diagram illustrating an example technique for manufacturing a carbon-carbon composite from a porous preform.

FIG. 1 is a flow diagram illustrating an example technique for manufacturing a C—C composite from a pitch-infiltrated preform using a controlled pressure and temperature ramp rate to control a growth of optical textures as the pitch is pyrolyzed to a coke matrix. For ease of illustration, the example method of FIG. 1 is described with respect to the articles and systems of FIGS. 2-6; however, other articles and systems for manufacturing C—C composites are also contemplated by this disclosure.

The example technique of FIG. 1 includes infiltrating a porous fiber preform with a pitch (10), initiating pyrolysis of at least some of the pitch at a first pressure less than about 2000 pounds per square inch (psi) (e.g., about 13.8 megapascals (MPa)) and a first temperature ramp rate to a first target temperature (12), and pyrolyze of at least some of the pitch at a second pressure greater than about 2000 psi and a second temperature ramp rate to a second target temperature. In some examples, the temperature ramp rates, target temperatures, and pressures exerted in steps (12) and (14) may be selectively varied to control the growth of the resultant optical textures produced during the conversion of the pitch to a coke matrix. In some examples, steps (10)-(14) may be repeated if needed to obtain densified C—C composite having a final density of at least 1.9 g/cc.

Figure 2:
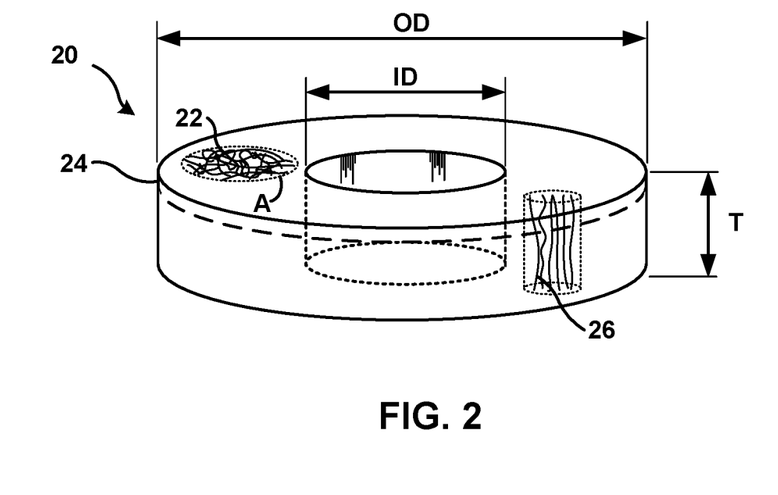
FIG. 2 is a perspective view of an example porous carbon preform that may be used to manufacture a densified carbon-carbon composite.
Figure 3:
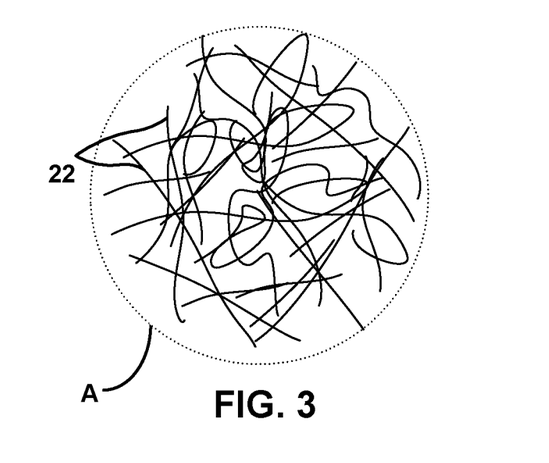
FIG. 3 is an enlargement of section A from FIG. 2.

The first step of the example technique of FIG. 1 includes infiltrating a porous carbon preform with pitch (10). FIG. 2 is a perspective view of an example preform 20 that may be used that may be used in the technique of FIG. 1 to manufacture a densified C—C composite. Preform 20 may include a plurality of carbon fibers or carbon-precursor fibers (collectively referred to as "fibers 22"). In some examples, fibers 22 may include fibers or carbon-precursor fibers including, for example, oxidized polyacrylonitrile (O-PAN), rayon, pitch, or the like. By way of example, FIG. 3 shows an enlargement of the portion A from FIG. 2, illustrating individual fibers 22 combined together to form non-woven layer 24 (e.g., web layer, tow layers, duplex web/tow layers, and the like). In some examples, the layers 24 may be formed to have an areal weight between about 1250 and about 3000 grams per square meter (g/m$^2$) such as, between about 1350 and about 2000 g/m$^2$. Fibers 22 may be woven, non-woven (e.g., webs or tows), chopped, or the like and may be combined to form one or more layers that are used to form preform 20.

In some examples, preform 20 may be formed form a plurality of layers 24 (e.g., fabric sheets) that include fibers 22. Layers 24 may be needled together with a plurality of needled fibers 26. In some examples, needled fibers 26 may be formed of materials substantially the same (e.g., the same or nearly the same) as fibers 22. For example, needled fibers 26 may include carbon fibers or carbon-precursor fibers including, for example, oxidized polyacrylonitrile (O-PAN), rayon, pitch, or the like. In some examples, needled fibers 26 may formed by fibers 22, which are punched/needled through two or more layers 24 as a result of the needling process. In some examples, at least one of fibers 22 or needled fibers 26 may be subjected to a carbonization cycle to convert any carbon-precursor materials to carbon fibers. The carbonization of fibers 22 or needled fibers 26, if needed, may be performed before or after infiltrating preform 20 with pitch (10).

In some examples, needled fibers 26 may be needled through multiple layers of layers 24 using, for example, a rotating annular needler or a non-rotating annular needler. In the case of annular needler, preform 20 may be formed by needling two or more layers of layers 24 together and then needling one or more additional layers 24 on top of the previously needled layers. In some examples, the annular needler may have a needle stroke rate of about 700 strokes per minute or more (for instance, a stroke speed between about 850 and about 1250 strokes/min) and a rotational bowl speed of about 2 rpm. In some examples, the needling time may be reduced by increasing the bowl rotation speed, e.g., 3 rpm, while keeping the ratio of strokes per rotation at about 350 strokes per rotation.

In some examples, when using an annular or non-annular needler, the initial layer of layers 24 may be placed on a pliable material, such as a foam ring, with subsequent layers 24 placed one on top of the initial layer to allow the needles and needled fibers 26 to penetrate all the way through the initial layer (e.g., into the pliable material) without damaging the needles or barbs. Needling of layers 24 may be continued until preform 20 reaches the target thickness T. Tables 1 and 2 below provide examples of preforms 20 envisioned for use with the method illustrated in FIG. 1.

TABLE 1

| Process Step | Rotating Annular Baseline | Rotating Annular Ex. 1 | Rotating Annular Ex. 2 |
|---|---|---|---|
| Fiber Type | O-PAN | O-PAN | O-PAN |
| Fabric Composition | 85% Continuous Tow 15% Staple | 75% Continuous Tow 25% Staple | 85% Continuous Tow 15% Staple |
| Fabric Weight | 1000 grams/square meter | 1250 grams/square meter | 1500 grams/square meter |
| Fabric Type | Needle punched nonwoven | Needle punched nonwoven | Needle punched nonwoven |
| Segment Dimensions | Inside Radius: 6 inches Outside Radius: 12 inches Arc: 68 degrees | Inside Radius: 6 inches Outside Radius: 12 inches Arc: 68 degrees | Inside Radius: 6 inches Outside Radius: 12 inches Arc: 68 degrees |

TABLE 1-continued

| Process Step | Rotating Annular Baseline | Rotating Annular Ex. 1 | Rotating Annular Ex. 2 |
|---|---|---|---|
| Needler Settings | Bowl Rotation: 2 rpm<br>Needler Stroke: 700 spm<br>Ratio: 350:1 | Bowl Rotation: 2 rpm<br>Needler Stroke: 700 spm<br>Ratio: 350:1 | Bowl Rotation: 2 rpm<br>Needler Stroke: 700 spm<br>Ratio: 350 to 1 |
| O-PAN Preform | Preform Wt: 6350 grams<br>Preform Thk: 1.900 inches | Preform Wt: 6350 grams<br>Preform Thk: 1.900 inches | Preform Wt: 6350 grams<br>Preform Thk: 1.900 inches |
| Needling Time (minutes) | Needling Time: 15 minutes | Needling Time: 12 minutes | Needling Time: 10 minutes |
| Carbonization Temp. | 1650° C. | 1650° C. | 1650° C. |
| Carbonized Preform | Preform Wt: 2950 grams<br>Preform Thk: 1.400 inches | Preform Wt: 2950 grams<br>Preform Thk: 1.400 inches | Preform Wt: 2950 grams<br>Preform Thk: 1.400 inches |

TABLE 2

| Process Step | Rotating Annular Baseline | Rotating Annular Ex. 3 | Rotating Annular Ex. 4 |
|---|---|---|---|
| Fiber Type | O-PAN | O-PAN | O-PAN |
| Fabric Composition | 85% Continuous Tow<br>15% Staple | 75% Continuous Tow<br>25% Staple | 85% Continuous Tow<br>15% Staple |
| Fabric Weight | 1000 grams/square meter | 1750 grams/square meter | 2000 grams/square meter |
| Fabric Type | Needle punched nonwoven | Needle punched nonwoven | Needle punched nonwoven |
| Segment Dimensions | Inside Radius: 6 inches<br>Outside Radius: 12 inches<br>Arc: 68 degrees | Inside Radius: 6 inches<br>Outside Radius: 12 inches<br>Arc: 68 degrees | Inside Radius: 6 inches<br>Outside Radius: 12 inches<br>Arc: 68 degrees |
| Needler Settings | Bowl Rotation: 2 rpm<br>Needler Stroke: 700 spm<br>Ratio: 350:1 | Bowl Rotation: 2 rpm<br>Needler Stroke: 700 spm<br>Ratio: 350 to 1 | Bowl Rotation: 2 rpm<br>Needler Stroke: 700 spm<br>Ratio: 350 to 1 |
| O-PAN Preform | Preform Wt: 6350 grams<br>Preform Thk: 1.900 inches | Preform Wt: 6350 grams<br>Preform Thk: 1.900 inches | Preform Wt: 6350 grams<br>Preform Thk: 1.900 inches |
| Needling Time (minutes) | Needling Time: 15 minutes | Needling Time: 9 minutes | Needling Time: 8 minutes |
| Carbonization Temp. | 1650° C. | 1650° C. | 1650° C. |
| Carbonized Preform | Preform Wt: 2950 grams<br>Preform Thk: 1.400 inches | Preform Wt: 2950 grams<br>Preform Thk: 1.400 inches | Preform Wt: 2950 grams<br>Preform Thk: 1.400 inches |

In some examples, preform 20 may be subjected to an initial carbonization cycle, if needed, to convert any carbon-precursor materials of fibers 22 and needled fibers 26 to carbon, prior to being infiltrated with pitch (10). For example, preform 20 may be carbonized by heating preform 20 in a retort such as an autoclave, a furnace, a hot isostatic press, a uniaxial hot press, or the like, under inert or reducing conditions to remove the non-carbon constituents (hydrogen, nitrogen, oxygen, etc.) from fibers 22 and needled fibers 26. In some examples, preform 20 may be heated in the inert atmosphere at a temperature in the range of about 600° C. to about 1000° C. while optionally being mechanically compressed. The mechanical compression may be used to define the geometry (e.g., thickness) of the preform 20 and the volume fraction of carbon in the preform (e.g., the volume of carbon divided by the total, bulk volume of the porous preform). In some examples, the retort may be purged gently with nitrogen for approximately 1 hour, then slowly heated to about 900° C. over the course of approximately 10-20 hours, followed by elevating the temperature to about 1050° C. over approximately 1-2 hours. The retort then may be held at about 1050° C. for approximately 3-6 hours before the carbonized preform is allowed to cool overnight. In some examples, the carbonization step can be carried out at even higher temperatures, including up to about 1800° C.

In some examples, after carbonization of preform 20, the preform may also be heat treated prior to undergoing the pitch infiltration (10). Heat treating preform 20 may modify the crystal structure of the carbon atoms of at least one of fibers 22 or needled fibers 26, which may result in modified mechanical, thermal, and chemical properties of the preform or composite respectively. In some examples, heat treatment of preform 20 may be conducted in the range of 1400° C. to 2800° C., depending on the desired characteristics. Higher temperatures may result in a greater thermal conductivity, a greater degree of crystalline order of the carbon atoms in the resultant porous preform, and may increase the elastic modulus of the final C—C composite.

In some examples, using a preform 20 as describe above may provide additional benefits during subsequent processing. For example, the carbonized form of preform 20 may be sufficiently rigid so that an initial densification cycle of CVD/CVI is not necessary to protect the preform 20 from potential damage, e.g., delamination, which might otherwise occur during the pitch infiltration step (10). Additionally or alternatively, in some examples, the manufacturing methods described in this disclosure for producing a densified C—C composite may omit CVD/CVI densification steps while also being able to obtain a densified C—C composite having a relatively high final density (e.g., greater than 1.9 g/cc) with coke matrices that include a plurality of size controlled optical textures. CVD/CVI processing is a relatively slow and expensive process requiring significant capital investment to implement. Furthermore, a single cycle of CVD/CVI generally provides only an incremental increase in the overall density of preform, thus requiring several cycles of CVD/CVI to obtain C—C composites having increased densities.

Figure 4:
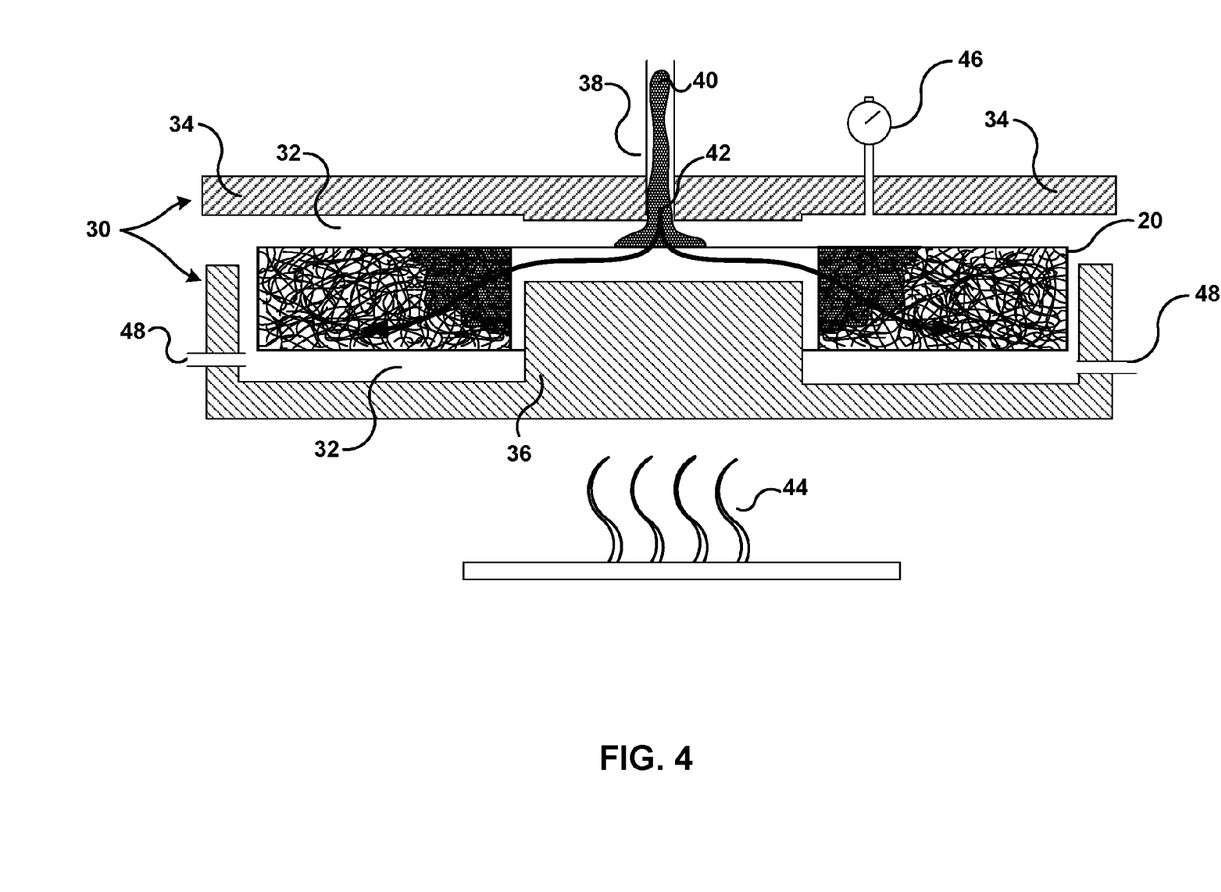
FIG. 4 is a schematic cross-sectional view of an example vessel that may be used to form a carbon-carbon composite.

The technique of FIG. 1 includes infiltrating preform 20 with pitch (10). Preform 20 may be infiltrated with a pitch using any suitable technique. In some examples, infiltrating preform 20 with pitch 40 may be conducted using, for example, RTM or VPI, which may involve depositing pitch 40 (e.g., in molten form) on the surface of preform 20 while subjecting preform 20 to a pressure differential that either draws (e.g., vacuum pressure of VPI) or forces (e.g., head pressure of RTM) pitch 40 into the open pores of preform 20. FIG. 4 is a schematic cross-sectional view of an example vessel 30 that may be used to infiltrate preform 20 with pitch 40. In some examples, vessel 30 may be used to infiltrate preform 20 with pitch 40 using a VPI process. For example, preform 20 may be placed in a vessel 30, which may include an upper portion 34 and a lower portion 36 that define an inner chamber 32 for receiving preform 20. The upper and lower portions 34 and 36 may be configured to form a tight seal. Once preform 20 is sealed within chamber 32, the internal environment of chamber 32 may be purged and evacuated to at least partially remove gases (e.g., oxygen) contained in the pores of preform 20 and in chamber 32. Vessel 30, including preform 20, may then be heated 44 under inert conditions to above the melting point of the pitch 40 (e.g., between about 90° C. to about 350° C.), but remain below the pyrolysis temperature of the pitch. At the same time, pitch 40 may be heated to a molten state and subsequently introduced into chamber 32 through pitch inlet port 38. The applied pressure gradient may draw pitch 40 into preform 20 as shown by flow lines 42. In some such examples the influx of pitch 40 may return chamber 32 to ambient pressure. In some VPI processes, a volume of molten pitch 40 may be melted in a different vessel and introduced into vessel 30 via a pitch inlet port 38.

In some examples, pitch 40 may be infiltrated into preform 20 using RTM. In an RTM process, preform 20 may be placed and sealed inside chamber 32. Once preform 20 is sealed within vessel 30, the internal environment of chamber 32 may be purged to at least partially remove oxidative gases (e.g., oxygen) contained in the pores of preform 20 and chamber 32. Vessel 30, including preform 20, may then be heated 44 under inert conditions to above the melting point of the pitch 40 to be infiltrated, but remain below the pyrolysis temperature of the pitch. Molten pitch 40 may then be injected into chamber 32 through one or more pitch inlet ports 38 under a low head pressure (e.g., less than about 1300 psi) that forces the molten pitch 40 into the inner pores of preform 20. In some examples, vessel 30 may include one or more vents 48 to allow gas in chamber 32 and preform 20 to escape as pitch 40 is introduced into the inner spaces of preform 20.

In some examples, pitch 40 may be infiltrated into preform 20 by depositing the pitch 40 in chamber 32 or directly on preform 20. Once upper portion 34 and lower portion 36 are closed and sealed, the pitch may be heated to a molten state, if needed, and the chamber 32 may be pressurized using an inert gas 46, thereby forcing pitch 40 into the inner pores of preform 20 (10).

While FIG. 4 depicts vessel 30 having only a single chamber 32 that is provided for a single preform 20, in other examples, vessel 30 may be configured with a chamber configured to hold a plurality of preforms. Alternatively, vessel 30 may be configured with a plurality of chambers each holding one or more porous carbon preforms so that the plurality of preforms may be densified using the describe pitch densifying process.

Pitch 40 used to infiltrate preform 20 (10) may include any suitable pitch. In some examples, pitch 40 may include one or more isotropic pitches or a combination of isotropic pitch and mesophase pitch. Example isotropic pitches may include, low cost coal tar pitches or petroleum pitches, a synthetic isotropic pitch, or the like. In some examples, pitch 40 may include coal tar pitch, coal-tar derived pitches, such as thermally or chemically treated coal tar, petroleum pitch, petroleum-derived pitches, synthetic-pitch derivatives, thermally treated pitches, catalytically converted pitches, and thermoset or thermoplastic resins, such as phenolic resins.

In some examples, isotropic pitches may be a lower cost alternative comparted to mesophase pitches. In addition to being lower cost, isotropic pitches may yield relatively low conversions of the pitch to large-sized optical textures (e.g., textures that define a major dimension greater than about 10 µm) using conventional carbonization techniques, particularly in comparison to mesophase pitches. The techniques disclosed herein may allow for the selective control of the growth of the optical textures in pitch 40 during the pyrolysis process for greater conversion (e.g., higher carbon yield) of the pitch (e.g., isotropic pitch) to coke matrices that include larger-sized optical textures (e.g., anisotropic and domain textures having that define a major dimension greater than 10 µm) as opposed to small-sized optical textures (e.g., or mosaic textures that define a major dimension less than about 10 µm). In some examples, the coke matrices formed by the pyrolysis of pitch 40 may include a higher concentration of large-sized optical textures (e.g., textures that define a major dimension of at least 10 µm) compared to conventional carbonization techniques. In some examples, the large-sized textures may be described as having a major dimension of at least 30 µm. In some examples, concentration of large-sized optical textures formed using the techniques described herein may be greater than about 80% by volume of the resultant coke matrix. The relative size and quantity of the optical textures may be determined using standardized optical microscopy techniques under polarized light.

While the present disclosure is primarily directed to the use of isotropic pitches, in some examples, a mesophase pitch may be used. Mesophase pitches are generally more expensive compared to isotropic pitches. Examples of mesophase pitches may include, for example, synthetic pitches such an aromatic pitch (AR) or a catalytically polymerized naphthalene. In some examples, pitch 40 may be a blend of isotropic and mesophase pitch.

Figure 5:
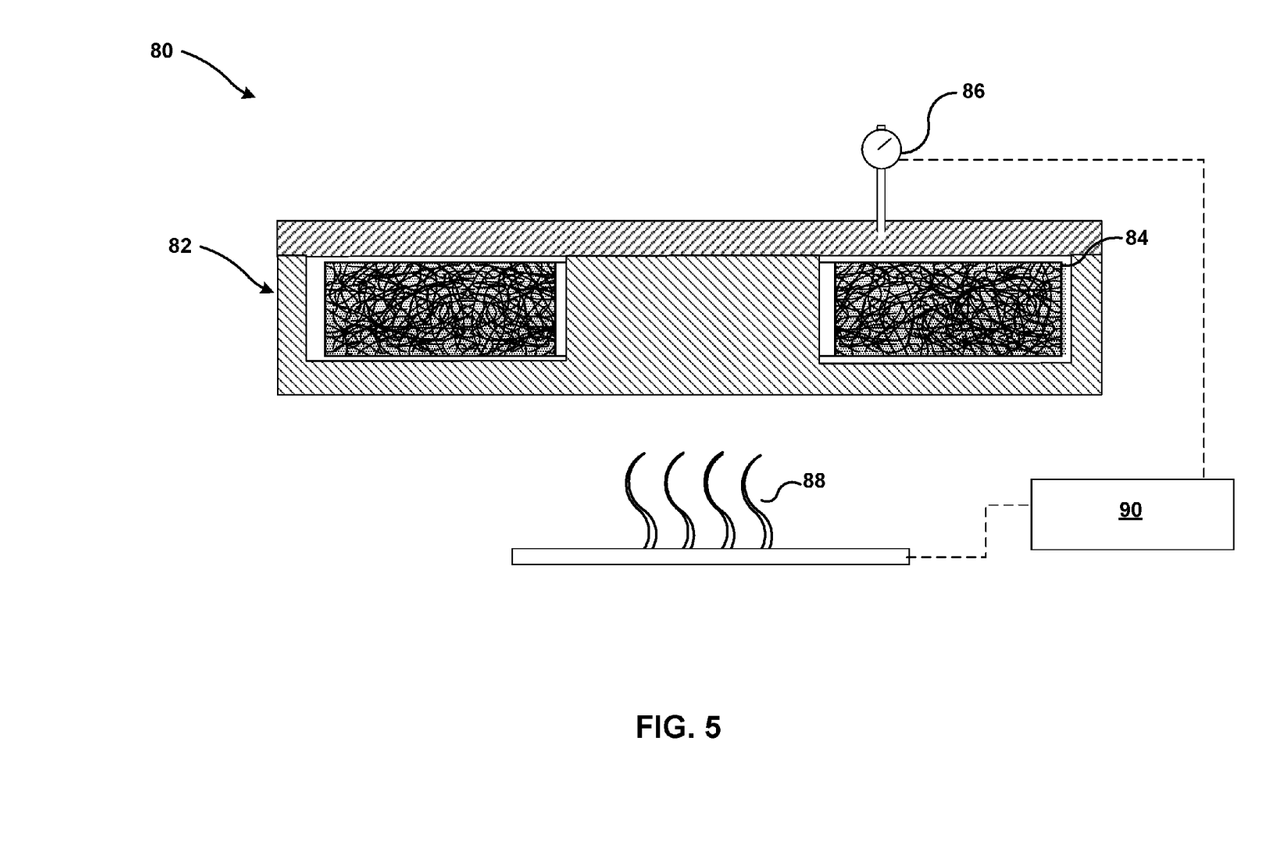
FIG. 5 is conceptual cross-sectional view of an example assembly that includes a vessel that includes pitch-infiltrated preform.

Once preform 20 has been at least partially infiltrated with pitch (10), preform 20 and pitch 40 may be subjected to an initial pyrolysis step (12). For example, FIG. 5 is conceptual cross-sectional view of an example assembly 80 that includes a vessel 82 that includes pitch-infiltrated preform 84 (e.g., preform 20 infiltrated with pitch 40). Assembly 80 includes a pressure source 86 and heat source 88 operated by control system 90. Vessel 82 may be configured withstand internal pressures in excess of 15,000 psi and temperatures up to 900° C. to convert pitch 40 to a coke matrix. In some examples, vessel 82 may be the same vessel (e.g., vessel 30) used to infiltrate preform 20 with pitch 40.

In some examples, assembly 80 may be configured to pyrolyze pitch 40 in pitch-infiltrated preform 84 using a controlled pressure and temperature ramp rate to selectively control a growth of optical textures as pitch 40 is pyrolyzed to a coke matrix. For example, assembly 80 may be configured to initiate pyrolysis of at least some of pitch 40 at a first pressure less than about 2000 psi and a first temperature ramp rate to a first target temperature (14). In some examples, controller 90 may selectively operate pressure source 86 to supply the first pressure to pitch-infiltrated preform 84. Depending on the desired size of the optical textures, the first pressure may be between a pressure greater than ambient pressure and less than about 2000 psi. For example, the first pressure may be about 50 psi to about 500 psi. In some examples where a higher concentration of large-sized optical textures is desired, the first pressure may remain relatively low (e.g., less than about 2000 psi) to allow for the optical textures to mature in size, which may otherwise be impeded by the use of high pressures.

In some examples, controller 90 may selectively operate heat source 88 to selectively control the first temperature ramp rate of pitch-infiltrated preform 84. For example, heat source 88 may heat pitch infiltrated preform from an initial temperature of pitch-infiltrated preform 84 (e.g., ambient temperature if pitch infiltrated preform 84 is initially cooled after pitch infiltration (10)) to a first target temperature (e.g., a temperature less than about 450° C.) at a first temperature ramp rate of about 5° C./hr to about 50° C./hr to initiate pyrolysis of pitch 40. In some examples, the first temperature ramp rate may include more than one temperature ramp rates applied over different temperature ranges. In some examples, the first pressure may be a set pressure or a range of pressures between about 50 psi and 2000 psi. Additionally or alternatively, in some examples, the heating process may include one or more hold periods where the temperature is held relatively constant at the first pressure for a set period of time to allow pitch-infiltrated preform 84 to bake for the set period of time.

In some examples where a higher final density or a higher concentration of large-sized optical textures is desired, the first ramp rate and first pressure may remain relatively low (e.g., a ramp rate of about 5° C./hr to about 15° C./hr and a first pressure less than about 1000 psi). Without wanting to be bound to a specific scientific theory, in some such examples, the combination of relatively low pressure and slow rate of temperature increase may help reduce the rate of loss of low molecular weight compounds from pitch 40 as the pitch 40 begins to convert to coke. Additionally or alternatively, maintaining the relatively low pressure and slow rate of temperature increase may help reduce the production and/or entrapment of voids within preform 20 otherwise established by gases evolved off of pitch 40 as the pitch is converted to coke. Additionally or alternatively, the described heating process may help control the microstructure of the resultant coke by allowing the produced optical texture to grow and coalesce to form a higher concentration of large-sized optical textures (e.g., optical textures with a major dimension greater than at least about 10 μm).

In some examples, the infiltration of preform 20 with pitch 40 (10) may be performed concurrently with initiating pyrolysis of pitch 40 (12). For example, pitch 40 may be heated to a molten state and infiltrated into preform 20. Once infiltrated, and without incurring a cooling step, the pressure and temperature ramp rate applied to the pitch-infiltrated preform 84 may be controlled to initiate the pyrolysis process (12).

After the initial pyrolysis step (12), a second pressure greater than about 2000 psi and a second temperature ramp rate may be applied to heat pitch-infiltrated preform 84 to a second target temperature to pyrolyze at least some f pitch 40 (14). In some examples, the second target temperature may be greater than the first target temperature and less than about 700° C. The second ramp rate may be between about 5° C./hr to about 50° C./hr or between about 10° C./hr to about 50° C./hr. In some examples, the second temperature ramp rate may include more than one temperature ramp rates applied over different temperature ranges. In some examples, the second pressure may be a set pressure or a range of pressures between about 2000 psi and about 15000 psi.

Additionally or alternatively, in some examples, the heating process may include one or more hold periods where the temperature is held relatively constant at the second pressure for a set period of time to allow pitch-infiltrated preform 84 to bake for the set period of time. For example, once the second target temperature has been reached, the temperature and pressure may be maintained for a sufficiently long period of time to allow pitch 40 to fully pyrolyze. In some examples, vessel 82 may be maintained at a second target temperature of at least about 650° C. for about 1 to about 6 hours to obtain sufficient conversion of pitch 40 to coke matrix 52.

Tables 3 below provide examples for the first and second pressures and first and second temperature ramp rates that may be used during the pyrolysis steps (12) and (14).

TABLE 3

| Pitch type | First Pressure (psi) | First Temperature Ramp Rate (° C./hr) | Second Pressure (psi) | First Temperature Ramp Rate (° C./hr) | Optical textures (vol. %) |
| --- | --- | --- | --- | --- | --- |
| Isotropic (coal tar) | 50-500 (variable) | 15 to 200° C., 10 to 300° C., 5 to 400° C., 5 hr hold at 400° C. | 500-10000 (variable) | 25 to 650° C. | 10% small-sized 90% large-sized |
| Isotropic (petroleum) Mesophase | 300-1000 (variable) | 5 to 450° C., 6 hr hold at 450° C. | 1000-14000 (variable) | 15 to 700° C. | 5% small-sized 95% large-sized |
| Isotropic (petroleum) | 100-500 (variable) | 10 to 250° C., 5 to 400° C., 6 hr hold at 400° C., 5 to 450° C. | 10000 (set) | 10 to 650° C. | 15% small-sized 85% large-sized |
| Isotropic (coal tar) | 100-300 (variable) | 10 to 450° C. | 5000 (set) | 20 to 700° C. | 20% small-sized 80% large-sized |
| Isotropic (2-phase) Mesophase | ambient-500 (variable) | 5 to 450° C. | 500-15000 (variable) | 20 to 700° C. | 5% small-sized 95% large-sized |

Figure 6A:
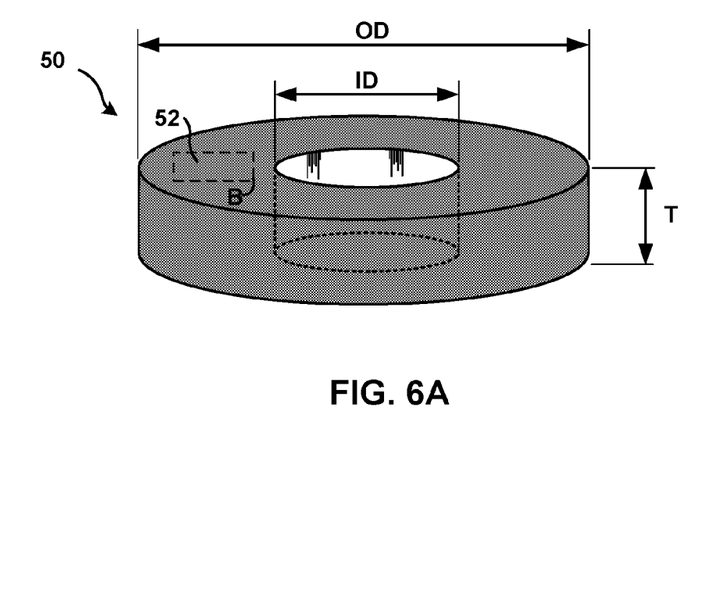
FIG. 6A is a perspective view of an example densified carbon-carbon composite.

FIG. 6A is a perspective view of an example C—C composite 50 formed by the technique of FIG. 1. In some examples, as described above, performing the pitch pyrolyzation steps (12) and (14) at the respective first and second pressure and first and second temperature ramp rates may lead to a C—C composite that includes optical textures of a selectively controlled size. Additionally or alternatively, the described techniques and may lead to a more efficient densification process. For example, infiltration of a preform with pitch using vacuum pressure infiltration (VPI) or pitch transfer molding (RTM), followed by carbonization under ambient pressures may require an initial stabilization cycle between infiltration and carbonization. Such stabilization cycles may include waiting a sufficient amount of time to allow the pitch in the preform to undergo some degree of crosslinking, thereby inhibiting the pitch from leeching out of the preform during the subsequent carbonization process.

The pitch stabilization cycle however can be extremely time intensive, requiring several months for the pitch to undergo sufficient crosslinking, and even with pitch stabilization, some amount of pitch may be forced out of the preform during carbonization because of gases evolved from the pitch as it is converted to coke. Additionally or alternatively, such techniques may result in the formation of coke matrices with a relatively higher concentration mosaic type optical textures (e.g., textures defining a major dimension less than 10 μm).

In some examples, infiltrating preform 20 with pitch 40 (10) and pyrolyzing pitch-infiltrated preform 84 under at the controlled pressures and temperature ramp rates (e.g., steps (12) and (14)) may bypass the need to perform an extended pitch-stabilization cycle. Instead, the pressures applied to pitch-infiltrated preform 84 may help reduce or substantially prevent (e.g., nearly prevent or fully prevent) pitch 40 from seeping out of preform 20 as the temperature of pitch 40 is increased to the point of pyrolysis. Additionally or alternatively, in some examples, as described above the pressure applied to the preform 20 infiltrated with pitch 40 may suppress the formation of unwanted voids within pitch 40 and preform 20 that may otherwise form as a result of gases evolving from pitch 40 as the pitch is converted to coke matrix, thereby increasing the density of the resultant C—C composite. The suppression of the voids within pitch 40 and preform 20 also helps retain pitch 40 in preform 20, as the evolution of gas may otherwise force some of pitch 40 out of preform 20 as pitch 40 carbonizes. In this way, pyrolyzing pitch 40 at the first and second pressures (12) and (14) may allow for greater retention and conversion of pitch 40 to coke matrix within preform 20, thereby resulting in a densified C—C composite 50 as shown in FIG. 5 with an overall density greater than what may be produced using conventional pitch-stabilization and pyrolyzation techniques. Further, by omitting pitch-stabilization, the manufacturing time used to form densified C—C composite 50 may be significantly reduced.

In some examples, the initial pyrolysis step (12) and second pyrolysis step (14) may be substantially consecutive (e.g., consecutive or nearly consecutive). For example, after the completion of the initial pyrolysis step (12) (e.g., the first target temperature is reached), the pressure applied to pitch infiltrated preform 84 may be increased to the second pressure. Depending on the relative difference between the first pressure and second pressure, the transition from the first to second pressure may be performed over the course of several minutes (e.g., an hour). Once the second pressure is obtained or during the transition period to the second pressure, the second temperature ramp rate heating may be initiated. In some examples, by controlling the relative rate at which the pressure transitions from the first pressure to the second pressure may assist in controlling the relative growth of the optical textures produced as pitch 40 is converted to the coke matrix.

Figure 6B:
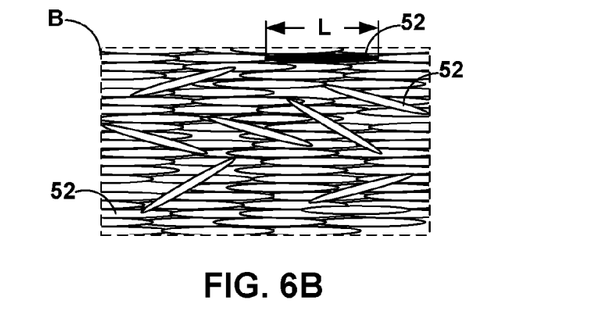
FIG. 6B is an enlargement of the portion B from FIG. 6A.

FIG. 6B is an enlargement of the portion B from FIG. 6A, illustrating coke matrix 52 produced by the pyrolyzation of pitch 40. As shown, coke matrix 52 may include large-sized optical textures that may define an elongated shape having a major dimension greater than at least about 10 μm. Such a microstructure may be referred to as including anisotropic or domain optical textures flow In some examples, the optical textures of coke matrix 52 may define an oriented arrangement as shown in FIG. 6; in other words, the optical textures of coke matrix 52 may be preferentially oriented (e.g. anisotropic arrangement). In other examples, the textures of coke matrix 52 may define a non-oriented arrangement (e.g., isotropic arrangement). The degree of crystallite orientation, and crystalline order (degree of graphitization) of the coke matrix 52 may be determined using, for example, optical microscopy, X-ray diffraction or Raman spectroscopy.

In some examples having optical textures of coke matrix 52 that define a major dimension greater than at least about 10 micrometers may help improve the properties of C—C composite 50 compared to mosaic type optical textures (e.g., small-sized optical textures that define a major dimensions of less than about 10 μm). For example, textures of coke matrix 52 may define a major dimension greater than at least about 10 micrometers, which may help with thermal conductivity, friction film formation, friction stability and wear rates.

In some examples, pyrolyzing pitch 40 at the first and second pressures (e.g., steps (12) and (14)) may be performed by pressurizing vessel 82 using a pressure source 86 that includes an inert gas such as nitrogen, argon, carbon dioxide, or the like. In some examples, infiltrating preform 20 with pitch 40 (10), initiating pyrolysis of pitch 40 at a first pressure (12), and pyrolyzing pitch 40 at a second pressure (14) may be conducted using the same vessel. In other examples, steps (10), (12), and (14) may be conducted using different vessels, or other systems.

Figure 7:
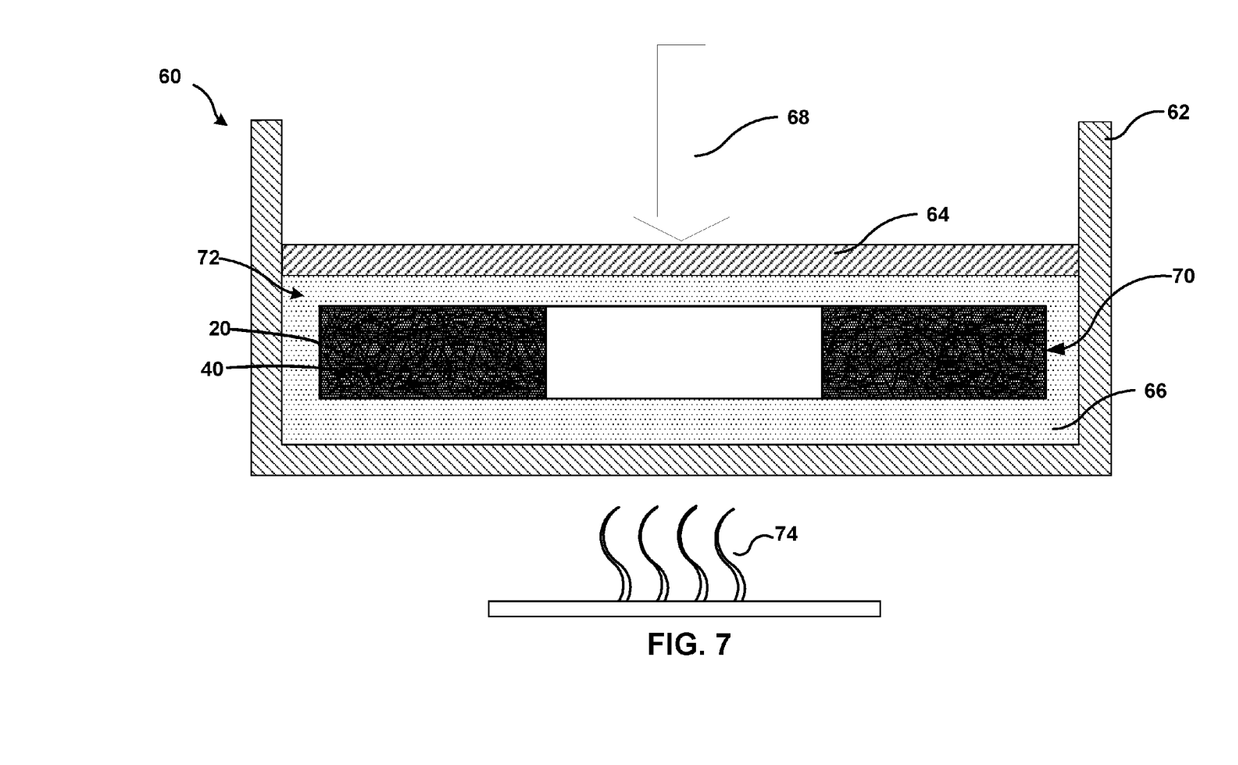
FIG. 7 is a schematic cross-sectional view of an example vessel enclosing a preform that has been previously infiltrated with pitch, which may be used to form a carbon-carbon composite.

In some examples, at least one of the pyrolysis steps (12) or (14) may be performed by applying isostatic pressure using a packing powder surrounding preform 20 and pitch 40. For example, FIG. 7 shows a schematic cross-sectional view of an example vessel 60 containing pitch-infiltrated preform 70 (e.g., preform 20 infiltrated with pitch 40), where the pitch-infiltrated preform 70 is substantially surrounded (e.g., surrounded or nearly surrounded) by a packing powder 66. Vessel 60 may include an upper mold portion 64 and a lower mold portion 62, which define an inner chamber 72 for receiving and substantially enclosing (e.g., enclosing or nearly enclosing) pitch-infiltrated preform 70 and packing powder 66. Once pitch-infiltrated preform 70 and packing powder 66 are deposited in inner chamber 72, upper mold portion 64 may be lowered to contact packing powder 66. A pressure source 68 may then apply a first pressure less than about 2000 psi to packing powder 66 while heating vessel 60 and its contents using a heat source 74 at the first temperature ramp rate (e.g., about 5° C./hr to about 15° C./hr) to the first target temperature (e.g., less than about 450° C.) (12). The pressure applied to packing power 66 will redistribute the pressure forces substantially evenly (e.g., evenly or nearly evenly) around pitch-infiltrated preform 70 establishing an isostatic pressure. Once the initial pyrolysis step (12) has been substantially completed, pressure source 68 may then apply a second pressure greater than about 2000 psi (e.g., greater than about 10,000 psi) to packing powder 66 while heating vessel 60 and its contents using a heat source 74 at a second temperature ramp rate (e.g., about 10° C./hr to about 25° C./hr) to the second target temperature (e.g., about 650° C.) to drive the pyrolysis of pitch 40 towards completion (14).

In some examples, vessel 60 may be formed of a rigid material configured to withstand the described high pressures generated by a pressure source 68. In some examples, pressure source 68 may include, for example, a hydraulic press, hydraulic or ball screws driven by electric servo motors, or the like. In other examples, vessel 60 may be formed of a semi-flexible material capable of withstanding the high temperatures of carbonization. In such configurations, the high pressure 68 may be established by pressurizing the outside of vessel 60, for example by using a high pressure gas supplied by pressure source 68 substantially evenly (e.g., evenly or nearly evenly) across the exterior of vessel 60. The flexibility of vessel 60 thereby compresses packing powder 60 and creates the isostatic pressure used during pyrolyzation.

Packing powder 66 may include any relatively fine grained material (e.g., 10 to 50 micron particles) capable of withstanding the high temperatures and pressures needed for pyrolyzing pitch-infiltrated preform 70 at high pressure (14) without packing powder 66 undergoing physical transformations, e.g., melting or clumping, chemical reaction with materials used for vessel 60 and pitch-infiltrated preform 70, or both. In some examples, packing powder 66 may include, for example, activated carbon, carbon dust, graphite powder, fine grained silica or sand, or the like.

In some examples, the resulting densified C—C composite 50 produced from the techniques described above may possess an overall density of at least 1.9 g/cc. In some examples, steps (10), (12), and (14) may be repeated to obtain densified C—C composite 50 having an overall density of at least 1.9 g/cc.

In some examples, C—C composite 50 may also be subjected to further machining to sculpt C—C composite 50 into the desired shape, such as a final brake disc shape. For example, in between the densification cycles the surfaces of C—C composite 50 may be ground down to partially expose the pores of the composite thereby allowing for additional densification cycles (10)-(14). Additionally or alternatively, once the final densified C—C composite 50 is obtained, densified C—C composite 50 may be ground using grinding equipment such as CNC (computer numerical control) machine to obtain a desired geometry. For example, densified C—C composite 50 may be ground in the shape of a densified C—C composite disc brake having a final thickness T (e.g., about 1.4 inches) having parallel and surfaces and defining an inside diameter ID and outside diameter OD of specified dimensions.

Various examples have been described. These and other examples are within the scope of the following claims.

What is claimed is:

1. A method of forming a carbon-carbon composite comprising:
    infiltrating a preform comprising carbon fibers or carbon-precursor fibers with a pitch to form an infiltrated preform;
    pyrolyzing the pitch in the infiltrated preform using a controlled pressure and temperature ramp rate to control a growth of optical textures as the pitch is pyrolyzed to a coke matrix, wherein pyrolyzing the pitch using the controlled pressure and temperature ramp rate comprises:
        initiating pyrolysis of at least some of the pitch at a first pressure and a first temperature ramp rate to a first target temperature to convert at least some of the pitch to the coke matrix, wherein the first pressure is less than about 2000 pounds per square inch (psi), and wherein the first temperature ramp is between about 5 degrees Celsius per hour (5° C./hr) and about 50° C./hr; and
        pyrolyzing at least some of the pitch at a second pressure and a second temperature ramp rate to a second target temperature, wherein the second pressure is greater than about 2000 psi, wherein the second temperature ramp rate is between about 5° C./hr and about 50° C./hr, and wherein the second target temperature is greater than the first target temperature.

2. The method of claim 1, wherein the coke matrix comprises at least about 80% by volume, large-sized optical textures that define a major dimension of at least 10 microns.

3. The method of claim 1, wherein the pitch comprises an isotropic pitch.

4. The method of claim 1, wherein pyrolyzing the pitch using a controlled pressure and controlled temperature, further comprises, increasing the pressure from the first pressure to the second pressure.

5. The method of claim 1, wherein the first temperature ramp rate is less than second temperature ramp rate.

6. The method of claim 1, wherein initiating pyrolysis comprises heating the preform and the pitch over a first range of temperatures at the first temperature ramp rate, wherein the first temperature range comprises a range of temperatures between an initial temperature below a pyrolysis temperature of the pitch and the first target temperature.

7. The method of claim 6, wherein the first temperature ramp rate comprises about 5° C./hr to about 25° C./hr.

8. The method of claim 1, wherein the first target temperature is less than about 450 degrees Celsius (° C.), and wherein the second target comprises a temperature less than about 700° C.

9. The method of claim 8, wherein the second temperature ramp rate comprises about 10° C./hr to about 50° C./hr.

10. The method of claim 1, further comprising cooling the infiltrated preform after infiltrating the preform with the pitch and before pyrolyzing the pitch in the infiltrated preform to allow at least some of the pitch to solidify in the preform.

11. A method for making a carbon-carbon composite brake disc, the method comprising:
    pyrolyzing a pitch in a preform using a controlled pressure and temperature ramp rate to control a growth of optical textures formed as the pitch is pyrolyzed to a coke matrix, wherein the preform comprises carbon fibers or carbon-precursor fibers, wherein the pitch comprises at least one isotropic pitch, and wherein pyrolyzing the pitch using the controlled pressure and temperature ramp rate comprises:
        heating the pitch and the preform in a vessel at a first pressure less than about 2000 pounds per square inch (psi) at a first temperature ramp rate between about 5 degrees Celsius per hour (5° C./hr) and about 50° C./hr to a first target temperature less than about 450 degrees Celsius (° C.) to convert at least some of the pitch to the coke matrix, wherein the coke matrix includes at least one optical texture;
        increasing a pressure in the vessel from the first pressure to a second pressure between 2000 psi and about 15,000 psi; and
        heating the pitch and the preform in the vessel at the second pressure, at a second temperature ramp rate between about 5° C./hr and about 50° C./hr to convert the remaining pitch to the coke matrix.

12. The method of claim 11, wherein the coke matrix comprises large-sized optical textures that each define a major dimension of at least 10 micrometers (μm).

13. The method of claim 12, wherein large-sized optical textures comprise at least about 80% by volume of the coke matrix.

14. The method of claim 11, further comprising holding the pitch and the preform at the first target temperature for a predetermined period of time of at least about one hour to convert at least some of the pitch to the coke matrix.

15. The method of claim 11, wherein and the first temperature ramp rate comprises about 5° C./hr to about 25° C./hr and the second temperature ramp rate comprises about 10° C./hr to about 25° C./hr.

16. The method of claim 11, wherein the pitch consists of isotropic pitch.

* * * * *